(12) United States Patent
Masukawa et al.

(10) Patent No.: US 7,851,914 B2
(45) Date of Patent: Dec. 14, 2010

(54) SEMICONDUCTOR INTEGRATED CIRCUIT DEVICE

(75) Inventors: Kazuyuki Masukawa, Yokohama (JP); Koji Hashimoto, Yokohama (JP); Hidefumi Mukai, Kawasaki (JP); Kosuke Yanagidaira, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/407,613

(22) Filed: Mar. 19, 2009

(65) Prior Publication Data
US 2009/0256265 A1 Oct. 15, 2009

(30) Foreign Application Priority Data
Apr. 15, 2008 (JP) .............................. 2008-106056

(51) Int. Cl.
H01L 23/48 (2006.01)
H01L 23/52 (2006.01)
H01L 29/40 (2006.01)

(52) U.S. Cl. ...................... 257/750; 257/773

(58) Field of Classification Search ................. 257/758, 257/750, 759, 773
See application file for complete search history.

(56) References Cited

U.S. PATENT DOCUMENTS

| 5,899,739 | A | 5/1999 | Ozaki |
| 7,326,993 | B2 * | 2/2008 | Kajimoto et al. ............. 257/315 |
| 7,675,125 | B2 * | 3/2010 | Park et al. ..................... 257/390 |
| 2005/0051831 | A1 * | 3/2005 | Kajimoto et al. ............. 257/314 |
| 2006/0270212 | A1 * | 11/2006 | Jung et al. ..................... 438/622 |
| 2008/0063988 | A1 | 3/2008 | Fukuhara et al. |
| 2008/0073635 | A1 * | 3/2008 | Kiyotoshi et al. ............. 257/2 |
| 2008/0079091 | A1 * | 4/2008 | Park et al. ..................... 257/390 |

FOREIGN PATENT DOCUMENTS

JP 11-297830 10/1999

* cited by examiner

*Primary Examiner*—Sheila V. Clark
(74) *Attorney, Agent, or Firm*—Finnegan, Henderson, Farabow, Garrett & Dunner, L.L.P.

(57) ABSTRACT

A semiconductor integrated circuit device includes a plurality of contact layers located between two lines running in parallel in a first direction. Each of the contact layers has a structure in which an upper contact and a lower contact are coupled together. The plurality of contact layers are arranged zigzag along the first direction, and coupling portions of the upper contact and the lower contact are displaced from the center of the upper contact in a second direction perpendicular to the first direction.

10 Claims, 4 Drawing Sheets

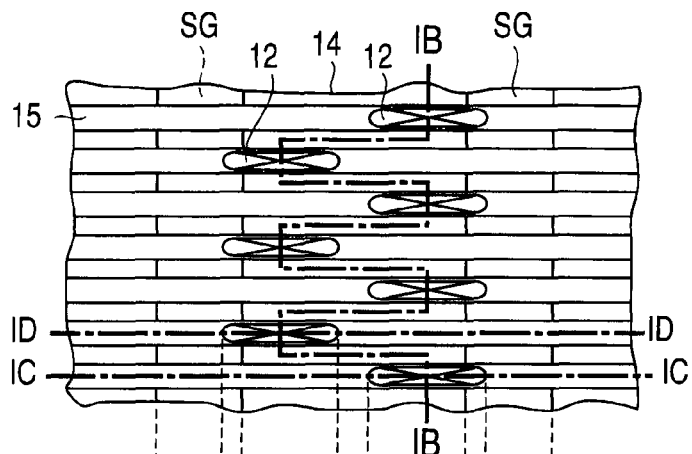
F I G. 1 A
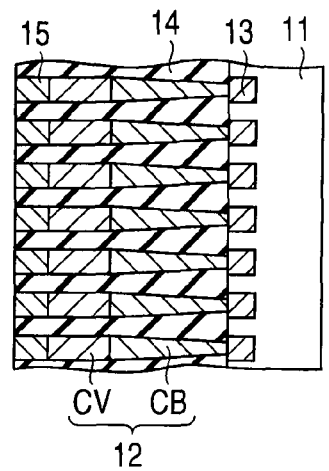
F I G. 1 B
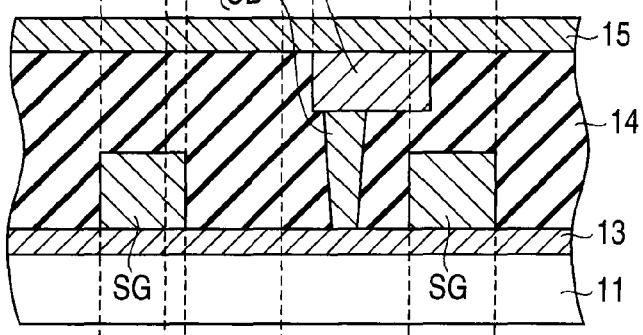
F I G. 1 C
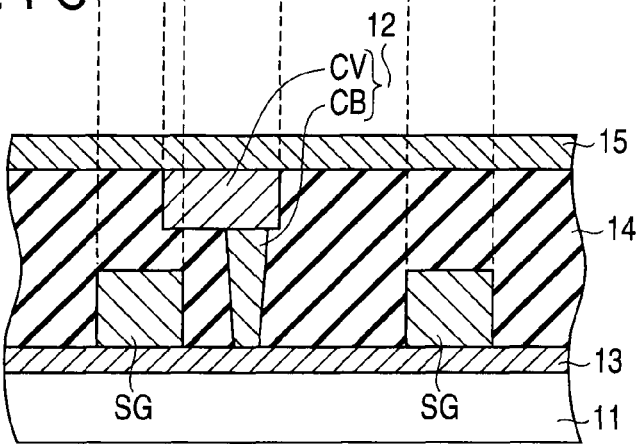
F I G. 1 D

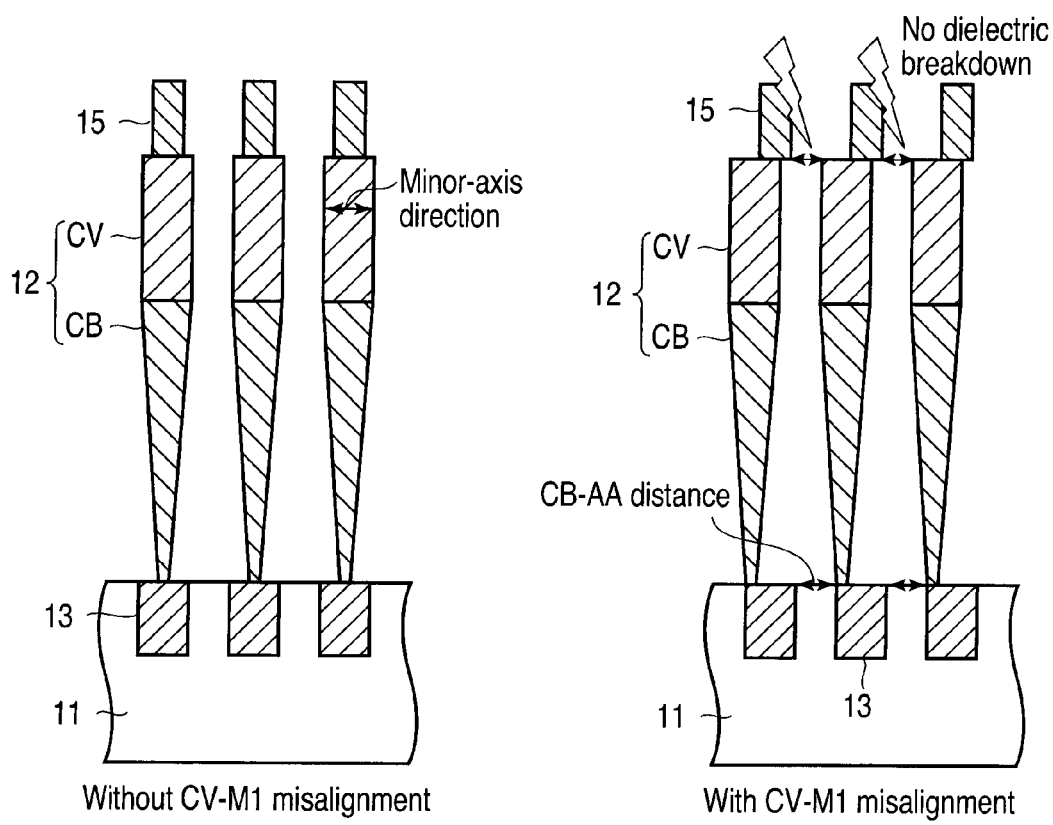
FIG. 4A  Without CV-M1 misalignment
FIG. 4B  With CV-M1 misalignment
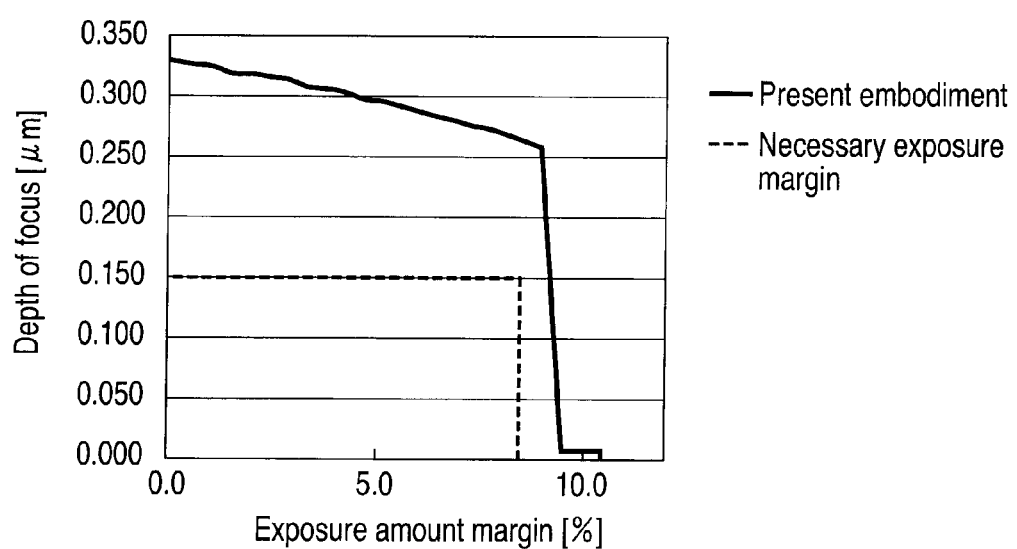
FIG. 6

US 7,851,914 B2

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2008-106056, filed Apr. 15, 2008, the entire contents of which are incorporated herein by reference.

BACKGROUND OF THE INVENTION

1. Field of the Invention

The present invention relates to a semiconductor integrated circuit device. More particularly, it relates to what is called a CB/CV continuous contact structure which is located between select gates of a NAND flash memory and in which a lower contact layer (lower contact CB) and an upper contact layer (upper contact CV) are coupled together.

2. Description of the Related Art

Recently, a CB/CV continuous contact structure has been used in a semiconductor integrated circuit device (see, for example, Jpn. Pat. Appln. KOKAI Publication No. 11-297830). The CB/CV continuous contact structure is located between select gates (SG, SG) in, for example, a NAND flash memory, and in this structure, a lower contact (CB) connected to a substrate (lower interconnect) is directly coupled to an upper contact (CV) connected to an upper M1 interconnect.

In the case of the NAND flash memory using this CB/CV continuous contact structure, the lower contact (CB) is limited in the dimension (length of the long-side direction of a CB pattern) in its width direction perpendicular to the select gate (SG) in order to prevent a dielectric breakdown (short-circuit) due to proximity to the select gate (SG). Moreover, the upper contact (CV) is limited in the dimension (length of the short-side direction of a CV pattern) in its width direction in which this upper contact adjoins the M1 interconnect in order to prevent a dielectric breakdown due to proximity to the M1 interconnect.

Thus, in the CB/CV continuous contact structure, limitations differ between on the lower contact (CB) and the upper contact (CV).

BRIEF SUMMARY OF THE INVENTION

According to a first aspect of the present invention, there is provided a semiconductor integrated circuit device comprising a plurality of contact layers located between two lines running in parallel in a first direction, each of the contact layers having a structure in which an upper contact and a lower contact are coupled together, wherein the plurality of contact layers are arranged zigzag along the first direction, and coupling portions of the upper contact and the lower contact are displaced from the center of the upper contact in a second direction perpendicular to the first direction.

According to a second aspect of the present invention, there is provided a semiconductor integrated circuit device comprising a plurality of contact layers located between two lines running in parallel in a first direction, each of the contact layers having a structure in which an upper contact and a lower contact are coupled together, wherein the plurality of contact layers are arranged zigzag along the first direction, and the bottom of the upper contact is located higher than the upper surfaces of the two lines running in parallel in the first direction.

BRIEF DESCRIPTION OF THE SEVERAL VIEWS OF THE DRAWING

FIGS. 1A to 1D are configuration diagrams showing one example of a semiconductor integrated circuit device (a CB/CV continuous contact structure in a NAND flash memory) according to a first embodiment of the present invention;

FIGS. 4A and 4B are sectional views shown to explain a dielectric breakdown between the upper contact and an M1 interconnect;

FIG. 6 is a graph shown to explain an exposure margin in the minor-axis direction of the upper contact (CV pattern).

DETAILED DESCRIPTION OF THE INVENTION

Figure 2:
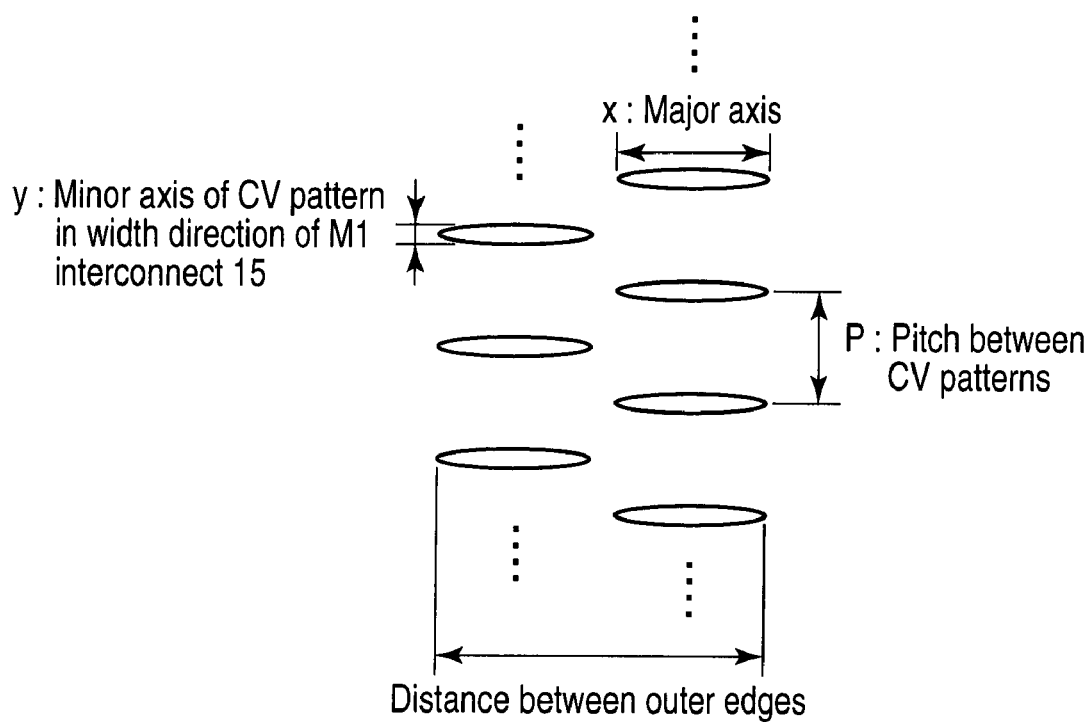
FIG. 2 is a planar view showing an example of the layout of upper contacts (CV patterns) in the CB/CV continuous contact structure according to the first embodiment.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

FIGS. 1A to 1D show an example of the configuration of a semiconductor integrated circuit device according to a first embodiment of the present invention. In the present embodiment, the configuration of a CB/CV continuous contact structure in a NAND flash memory is described. In addition, FIG. 1A is a plan view partially through the CB/CV continuous contact structure, FIG. 1B is a sectional view along line IB-IB in FIG. 1A, FIG. 1C is a sectional view along line IC-IC in FIG. 1A, and FIG. 1D is a sectional view along line ID-ID in FIG. 1A.

As shown in FIGS. 1A to 1D, select gates SG, SG are provided in parallel with each other on a semiconductor substrate 11 along a first direction. A plurality of CB/CV continuous contact layers (CB/CV continuous contact structures) 12 in which lower contacts CB and upper contacts CV are directly coupled together are arranged between the select gates SG, SG. The side of each lower contact CB which is not in contact with the upper contact CV (the bottom of CB pattern) is connected to a lower interconnect (AA) 13 provided in the surface part of the semiconductor substrate 11. The lower interconnects (AA) 13 are provided along a second direction perpendicular to the first direction. The side of each upper contact CV which is not in contact with the contact CB (the top of a CV pattern) is connected to an upper M1 interconnect 15 arranged in the surface part of an interlayer insulating film 14. The M1 interconnects 15 are arranged along the second direction. The upper contact CV is disposed so that the bottom of its CV pattern (the surface in contact with the lower contact CB) is located higher than the upper surface of the select gate SG.

The plurality of CB/CV continuous contact layers 12 are arranged zigzag along the first direction. Thus, the distance between the upper contacts can be greater than when the CB/CV continuous contact layers are aligned.

For example, as shown in FIG. 2, the upper contact CV has a substantially elliptical plane, and the pitch between the CV patterns is P. The major-axis dimension of the upper contact CV (length of the CV pattern in the long-side direction) corresponding to the extending (longitudinal) direction of the M1 interconnect 15 is x. The minor-axis dimension of the upper contact CV (length of the CV pattern in the short-side direction) corresponding to the width direction (first direction) of the M1 interconnect 15 is y.

Figure 3:
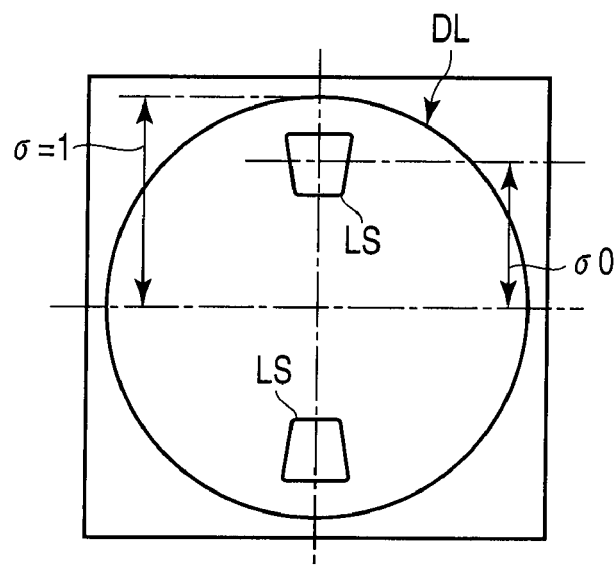
FIG. 3 is a diagram showing an example of the configuration of a two-point illumination used for the formation of the upper contacts.

Here, a two-point illumination (dipole illumination) DL, for example, as shown in FIG. 3 is used for the formation of the upper contact CV (for illumination in lithography). This dipole illumination DL is designed to expose a CV pattern image corresponding to at least the upper contacts CV by use of a desired mask pattern which is not shown. The dipole illumination DL used in the present embodiment has opening provided at positions symmetrical with respect to its center along the first direction. That is, the opening position of the dipole illumination DL (the position of a light source LS with respect to the center of the dipole illumination DL) is provided by the following equation:

$$\sigma 0 = \lambda/2P \cdot NA$$

where σ0 is the position of an illumination opening in the pupil plane of a projection optical system provided in an exposure apparatus (not shown), λ is an exposure wavelength, P is the pitch between the CV patterns, and NA is the numerical aperture of the projection optical system.

The above equation indicates the opening position σ0 of the dipole illumination DL advantageous to the formation of a line-and-space (L/S) having the pitch P between the CV patterns. The use of the dipole illumination DL as described above makes it possible to improve the exposure margin (exposure amount margin and depth of focus) in the minor-axis direction of the CV pattern.

The reason is that the major-axis dimension x of the upper contact CV can be greater than the major-axis dimension of the lower contact CB. The length of the lower contact CB corresponding to the second direction (major-axis dimension of the CV pattern) needs to be smaller than the distance between the select gates SG, SG, but the upper contact CV does not have such a limitation. This is because the upper contact CV is disposed so that the bottom of the CV pattern is located higher than the upper surfaces of the select gates SG, SG. This makes it possible to prevent the upper contacts CV from contacting the select gates SG, SG even if the distance between the outer edges of the CV patterns shown in FIG. 2 is increased. The area of the CV pattern increases due to the increase of the major-axis dimension x, so that the exposure margin in the major-axis direction can be improved. Moreover, the use of the above-mentioned dipole illumination DL enables improvements the exposure margins in the major-axis direction as well as in the minor-axis direction of the upper contact CV.

The increase in the distance between the outer edges of the CV patterns does not matter much because an improvement in the exposure margin in the minor-axis direction of the upper contact CV permits a reduction in the minor-axis dimension y of the upper contact CV. As a result, for example, as shown in FIGS. 4A and 4B, a dielectric breakdown between the upper contact CV and the M1 interconnect 15 in the event of misalignment can be prevented. It goes without saying that a dielectric breakdown between the upper contacts CV can also be prevented. Consequently, there is no need to increase the pitch between the upper contact CV and the M1 interconnect 15, and an increase in chip size can be kept down.

In addition, the bottom side of the CB pattern of the lower contact CB can be tapered to secure the distance between the lower contact CB and the adjacent lower interconnect (AA) 13.

On the other hand, the lower contact CB is formed to have a substantially elliptical plane, and the major-axis dimension of the CB pattern is smaller than the major-axis dimension x of the CV pattern, as shown in FIGS. 1A to 1D. The reason is that the width (second direction) of the lower contact CB needs to be smaller than the distance between the select gates SG, SG as described above. In addition, the major-axis dimension of the lower contact CB can be increased within the distance between the select gates SG, SG.

Figure 5:
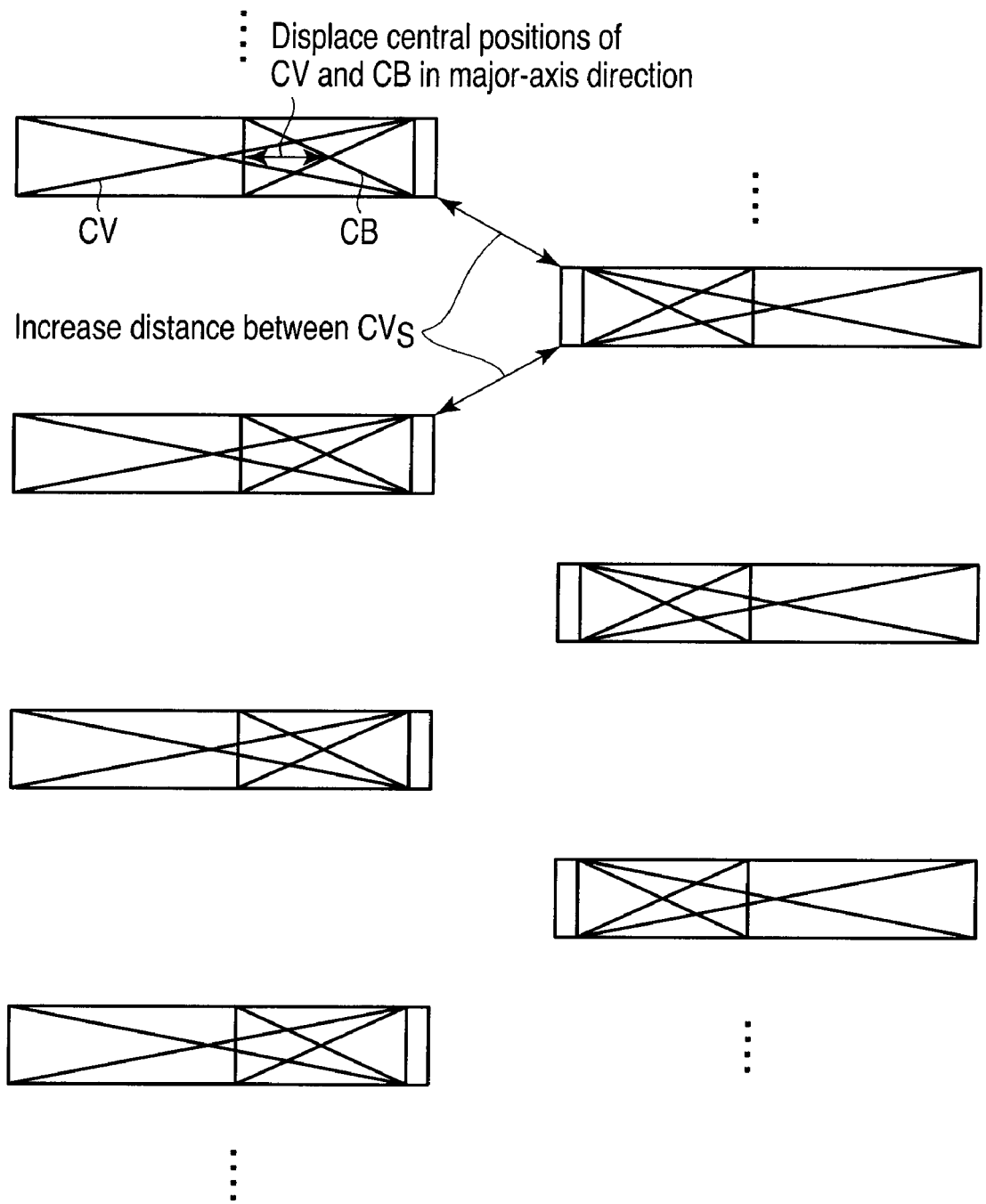
FIG. 5 is a diagram illustrating a contact portion between a lower contact and an upper contact.

FIG. 5 schematically shows an extracted contact portion between the above-described lower contact CB and the upper contact CV. The planar shape of the contacts is rectangular in FIG. 5, but can be elliptical instead.

In the present embodiment, the central position of the CV pattern and/or the central position of the CB pattern are/is offset in the major-axis direction (second direction), as shown in FIGS. 1A to 1D. For example, as shown in FIG. 5, when the central positions of the CV patterns are displaced outward (toward the select gates SG, SG) from the central positions of the CB patterns, the distance between the adjacent upper contacts CV can be increased without changing the pitch of the M1 interconnects 15. As a result, the upper contacts are not aligned, so that a dielectric breakdown between the upper contacts CV can be prevented even when the minor-axis dimension y of the CV pattern is increased. In contrast, when the central positions of the CB patterns are displaced inward (opposite to the select gates SG, SG) from the central positions of the CV patterns, the distance between the select gates SG, SG can be reduced to such a degree that the select gates SG, SG do not contact the lower contacts CB. This makes it possible to keep down an unnecessary increase in chip size in the second direction.

FIG. 6 shows an exposure margin in the minor-axis direction of the CV pattern in the case of the configuration described above.

As apparent from this graph, in the case of the CB/CV continuous contact structure as shown in FIGS. 1A to 1D, the use of the dipole illumination DL shown in FIG. 3 makes it possible to improve the exposure margin much further than a necessary exposure margin. Consequently, the increase of the pitch of the M1 interconnects 15 in the width direction can be kept down, so that it is possible to prevent an increase in the manufacturing cost of the semiconductor device due to an increase in chip size in the first direction.

According to the present embodiment, in the CB/CV continuous contact layer 12 between the select gates SG, SG in the NAND flash memory, the major-axis dimension x of the CV pattern is greater than the major-axis dimension x of the CB pattern in the lower contact CB limited in the increase of the major-axis dimension, such that the exposure margin during the formation of the upper contact CV can be improved. As a result, the minor-axis dimension y of the CV pattern can be reduced, so that the distance between the CV pattern and the adjacent M1 interconnect 15 is more easily secured, and a dielectric breakdown between the upper contact CV and the M1 interconnect 15 can be easily prevented even in the event of misalignment. Moreover, the distance between the upper contacts CV can be secured without increasing the pitch of the M1 interconnects 15, and a dielectric breakdown between the upper contacts CV can also be prevented.

Particularly when the central position of the CV pattern and the central position of the CB pattern are offset in the major-axis direction to substantially align the lower contacts CB, the distance between the select gates SG, SG can be reduced. Thus, it is possible to minimize an increase in chip size in the second direction when the CB/CV continuous contact layers 12 are arranged zigzag.

As described above, the CB/CV continuous contact layers 12 are arranged zigzag between the select gates SG, SG, and the lower contact CB is displaced inward from the central position of the upper contact CV. Consequently, in the CB/CV continuous contact structure, the major-axis dimension x of the CB pattern can be easily controlled, and dimensional accuracy in the minor-axis dimension of the upper contact CV can be improved. Thus, it is possible to prevent the contact between the select gates SG, SG and the lower contacts CB, and also prevent a dielectric breakdown between the upper contact CV and the M1 interconnect 15.

In addition, the present embodiment is not limited to the CB/CV continuous contact layer located between the select gates SG, SG in the NAND flash memory. For example, the present embodiment is also applicable to every semiconductor integrated circuit device located between two parallel lines and having a structure in which a lower contact and an upper contact are coupled together.

Furthermore, both the lower contact CB and the upper contact CV are not limited to having an elliptical plane. For example, one or both of the contacts may have a rectangular plane.

Still further, the short-side widths (minor-axis dimensions) of the lower contact CB and the upper contact CV do not have to be the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising a plurality of contact layers located between two lines running in parallel in a first direction, each of the contact layers having a structure in which an upper contact and a lower contact are coupled together,
   wherein the plurality of contact layers are arranged zigzag along the first direction, coupling portions of the upper contact and the lower contact are displaced from the center of the upper contact in a second direction perpendicular to the first direction, a long-side direction of the lower contact is the second direction and a short-side direction thereof is the first direction, and a dimension of the lower contact in the long-side direction is smaller than that of the upper contact.

2. The semiconductor integrated circuit device according to claim 1, wherein the coupling portions of the upper contact and the lower contact are displaced away from the two lines running in parallel in the first direction.

3. The semiconductor integrated circuit device according to claim 1, wherein the two lines running in parallel in the first direction are select gates in a NAND flash memory.

4. The semiconductor integrated circuit device according to claim 1, wherein the bottom of the upper contact is located higher than the upper surfaces of the two lines running in parallel in the first direction.

5. The semiconductor integrated circuit device according to claim 1, wherein non-coupling portions of the lower contacts are connected to lower interconnects provided along the second direction, the non-coupling portions of the lower contacts are tapered, and non-coupling portions of the upper contacts are connected to upper interconnects arranged along the second direction.

6. A semiconductor integrated circuit device comprising a plurality of contact layers located between two lines running in parallel in a first direction, each of the contact layers having a structure in which an upper contact and a lower contact are coupled together,
   wherein the plurality of contact layers are arranged zigzag along the first direction, the bottom of the upper contact is located higher than the upper surfaces of the two lines running in parallel in the first direction, non-coupling portions of the lower contacts are connected to lower interconnects provided along a second direction perpendicular to the first direction, the non-coupling portions of the lower contacts are tapered, and non-coupling portions of the upper contacts are connected to upper interconnects arranged along the second direction.

7. The semiconductor integrated circuit device according to claim 4, wherein the coupling portions of the upper contact and the lower contact are displaced away from the two lines running in parallel in the first direction.

8. The semiconductor integrated circuit device according to claim 4, wherein the two lines running in parallel in the first direction are select gates in a NAND flash memory.

9. The semiconductor integrated circuit device according to claim 4, wherein non-coupling portions of the lower contacts are connected to lower interconnects provided along a second direction perpendicular to the first direction, the non-coupling portions of the lower contacts are tapered, and non-coupling portions of the upper contacts are connected to upper interconnects arranged along the second direction.

10. A semiconductor integrated circuit device comprising a plurality of contact layers located between two lines running in parallel in a first direction, each of the contact layers having a structure in which an upper contact and a lower contact are coupled together,
    wherein the plurality of contact layers are arranged zigzag along the first direction, coupling portions of the upper contact and the lower contact are displaced from the center of the upper contact in a second direction perpendicular to the first direction, non-coupling portions of the lower contacts are connected to lower interconnects provided along the second direction, the non-coupling portions of the lower contacts are tapered, and non-coupling portions of the upper contacts are connected to upper interconnects arranged along the second direction.

* * * * *